(12) United States Patent
Chen et al.

(10) Patent No.: US 10,109,607 B2
(45) Date of Patent: Oct. 23, 2018

(54) UNDER BUMP METALLURGY (UBM) AND METHODS OF FORMING SAME

(71) Applicant: Taiwan Semiconductor Manufacturing Company, Ltd., Hsinchu (TW)

(72) Inventors: Wei-Yu Chen, Taipei (TW); Hsien-Wei Chen, Hsinchu (TW); An-Jhih Su, Taoyuan (TW); Cheng-Hsien Hsieh, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/722,578

(22) Filed: Oct. 2, 2017

(65) Prior Publication Data

US 2018/0026002 A1    Jan. 25, 2018

Related U.S. Application Data

(62) Division of application No. 14/788,182, filed on Jun. 30, 2015, now Pat. No. 9,793,231.

(51) Int. Cl.
*H01L 23/00* (2006.01)
*H01L 23/498* (2006.01)
*H01L 21/768* (2006.01)

(52) U.S. Cl.
CPC ........ *H01L 24/13* (2013.01); *H01L 21/76885* (2013.01); *H01L 23/49816* (2013.01); *H01L 24/03* (2013.01); *H01L 24/05* (2013.01); *H01L 24/11* (2013.01); *H01L 2224/024* (2013.01); *H01L 2224/0231* (2013.01); *H01L 2224/02166* (2013.01); *H01L 2224/02379* (2013.01); *H01L 2224/03622* (2013.01); *H01L 2224/0401* (2013.01); *H01L 2224/05024* (2013.01); *H01L 2224/11334* (2013.01);
(Continued)

(58) Field of Classification Search
CPC ......... H01L 24/13; H01L 24/11; H01L 24/05; H01L 24/03; H01L 21/76885; H01L 23/49816
USPC ......... 257/737, 738, 751, E23.021, E23.023, 257/E21.476, E21.508; 438/613, 614, 438/615
See application file for complete search history.

(56) References Cited

U.S. PATENT DOCUMENTS 6,150,725 A * 11/2000 Misawa .............. H01L 23/3171
                                                      257/725
7,816,252 B2    10/2010 Yu et al.
8,361,842 B2    1/2013 Yu et al.
(Continued)

FOREIGN PATENT DOCUMENTS

CN    103311212 A    9/2013
KR    20150030134 A    3/2015
(Continued)

*Primary Examiner* — Dao H Nguyen
(74) *Attorney, Agent, or Firm* — Slater Matsil, LLP

(57) ABSTRACT

A device package includes a die, fan-out redistribution layers (RDLs) over the die, and an under bump metallurgy (UBM) over the fan-out RDLs. The UBM comprises a conductive pad portion and a trench encircling the conductive pad portion. The device package further includes a connector disposed on the conductive pad portion of the UBM. The fan-out RDLs electrically connect the connector and the UBM to the die.

20 Claims, 9 Drawing Sheets

(52) U.S. Cl.
CPC ............... *H01L 2224/13014* (2013.01); *H01L 2224/13016* (2013.01); *H01L 2924/2064* (2013.01)

(56) References Cited

U.S. PATENT DOCUMENTS

| | | | |
|---|---|---|---|
| 8,680,647 | B2 | 3/2014 | Yu et al. |
| 8,703,542 | B2 | 4/2014 | Lin et al. |
| 8,759,964 | B2 | 6/2014 | Pu et al. |
| 8,778,738 | B1 | 7/2014 | Lin et al. |
| 8,785,299 | B2 | 7/2014 | Mao et al. |
| 8,803,306 | B1 | 8/2014 | Yu et al. |
| 8,809,996 | B2 | 8/2014 | Chen et al. |
| 8,829,676 | B2 | 9/2014 | Yu et al. |
| 8,877,554 | B2 | 11/2014 | Tsai et al. |
| 9,425,121 | B2 | 8/2016 | Tsai et al. |
| 2002/0173134 | A1 | 11/2002 | Viswanadam et al. |
| 2010/0237495 | A1 | 9/2010 | Pagaila et al. |
| 2011/0193224 | A1* | 8/2011 | Ito .................. H01L 23/3157 257/737 |
| 2011/0291288 | A1 | 12/2011 | Wu et al. |
| 2012/0241985 | A1* | 9/2012 | Topacio .............. H01L 24/03 257/782 |
| 2012/0295402 | A1 | 11/2012 | Lee et al. |
| 2012/0326299 | A1* | 12/2012 | Topacio ............. H01L 23/3171 257/737 |
| 2013/0026468 | A1 | 1/2013 | Yoshimuta et al. |
| 2013/0048358 | A1 | 2/2013 | Kanki et al. |
| 2013/0062760 | A1 | 3/2013 | Hung et al. |
| 2013/0062761 | A1 | 3/2013 | Lin et al. |
| 2013/0168805 | A1 | 7/2013 | Yu et al. |
| 2013/0168848 | A1 | 7/2013 | Lin et al. |
| 2013/0234309 | A1 | 9/2013 | Shin et al. |
| 2013/0307140 | A1 | 11/2013 | Huang et al. |
| 2014/0061923 | A1 | 3/2014 | Chen et al. |
| 2014/0159233 | A1 | 6/2014 | Lin et al. |
| 2014/0203429 | A1 | 7/2014 | Yu et al. |
| 2014/0203438 | A1 | 7/2014 | Chen et al. |
| 2014/0225222 | A1 | 8/2014 | Yu et al. |
| 2014/0252593 | A1 | 9/2014 | Chen |
| 2014/0252611 | A1 | 9/2014 | Chen et al. |
| 2014/0252646 | A1 | 9/2014 | Hung et al. |
| 2014/0264930 | A1 | 9/2014 | Yu et al. |
| 2015/0123269 | A1 | 5/2015 | Chen et al. |
| 2015/0162289 | A1 | 6/2015 | Chang et al. |
| 2016/0064346 | A1* | 3/2016 | Ootsuki .................. H01L 24/05 257/774 |

FOREIGN PATENT DOCUMENTS

| | | |
|---|---|---|
| TW | 201041058 A | 11/2010 |
| TW | 201409647 A | 3/2014 |
| TW | 201423918 A | 6/2014 |

* cited by examiner

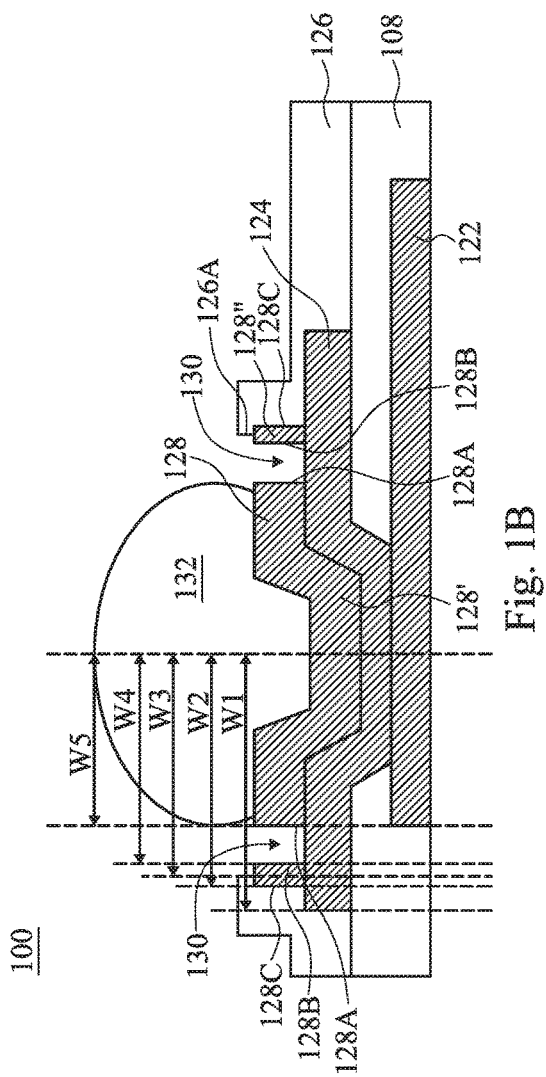
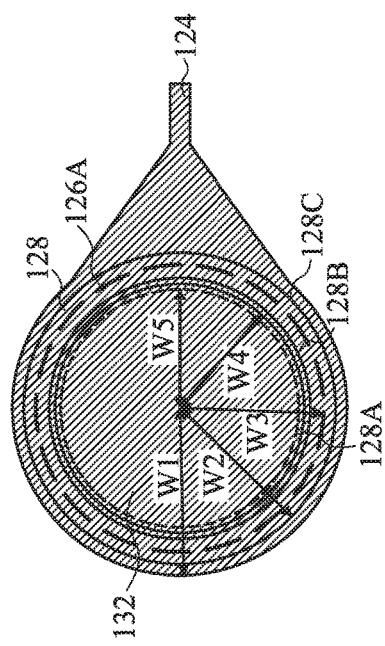
Fig. 1B
Fig. 1C

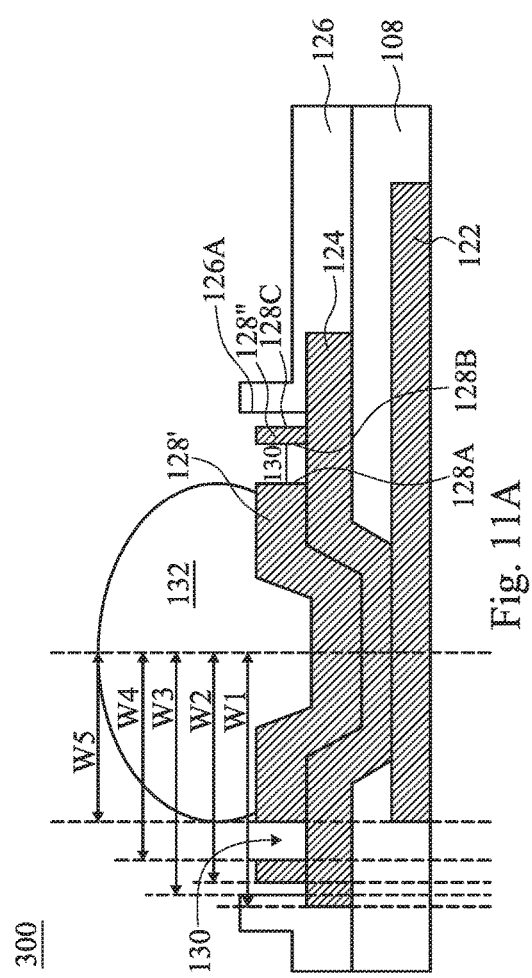
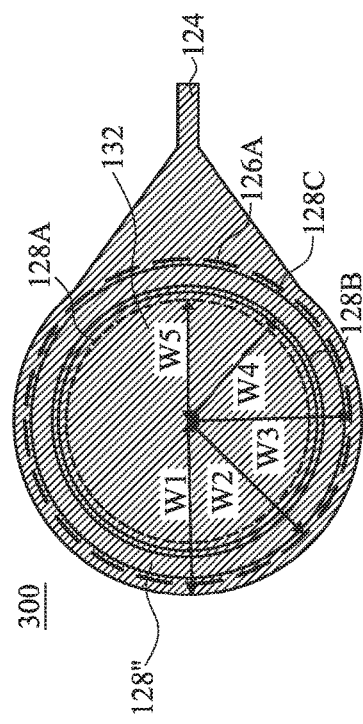
Fig. 11A
Fig. 11B

UNDER BUMP METALLURGY (UBM) AND METHODS OF FORMING SAME

PRIORITY CLAIM AND CROSS-REFERENCE

This application is a divisional application of U.S. patent application Ser. No. 14/788,182, filed Jun. 30, 2015, and entitled "Under Bump Metallurgy (UBM) and Methods of Forming Same," which application is hereby incorporated herein by reference.

BACKGROUND

In an aspect of conventional packaging technologies, such as wafer level packaging (WLP), redistribution layers (RDLs) may be formed over a die and electrically connected to active devices in a die. External input/output (I/O) pads such as solder balls on under-bump metallurgy (UBMs) may then be formed to electrically connect to the die through the RDLs. An advantageous feature of this packaging technology is the possibility of forming fan-out packages. Thus, the I/O pads on a die can be redistributed to a greater area than the die, and hence the number of I/O pads packed on the surfaces of the dies can be increased.

In such packaging technologies, a molding compound may be formed around the die to provide surface area to support the fan-out interconnect structures. For example, RDLs typically include one or more polymer layers formed over the die and molding compound. Conductive features (e.g., conductive lines and/or vias) are formed in the polymer layers and electrically connect I/O pads on the die to the external I/O pads over the RDLs. The external I/O pads may be disposed over both the die and the molding compound.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A through 1C illustrate cross-sectional views of device packages in accordance with some embodiments.

FIGS. 11A and 11B illustrate cross-sectional views of a device package in accordance with some alternative embodiments.

DETAILED DESCRIPTION

Figure 1A:
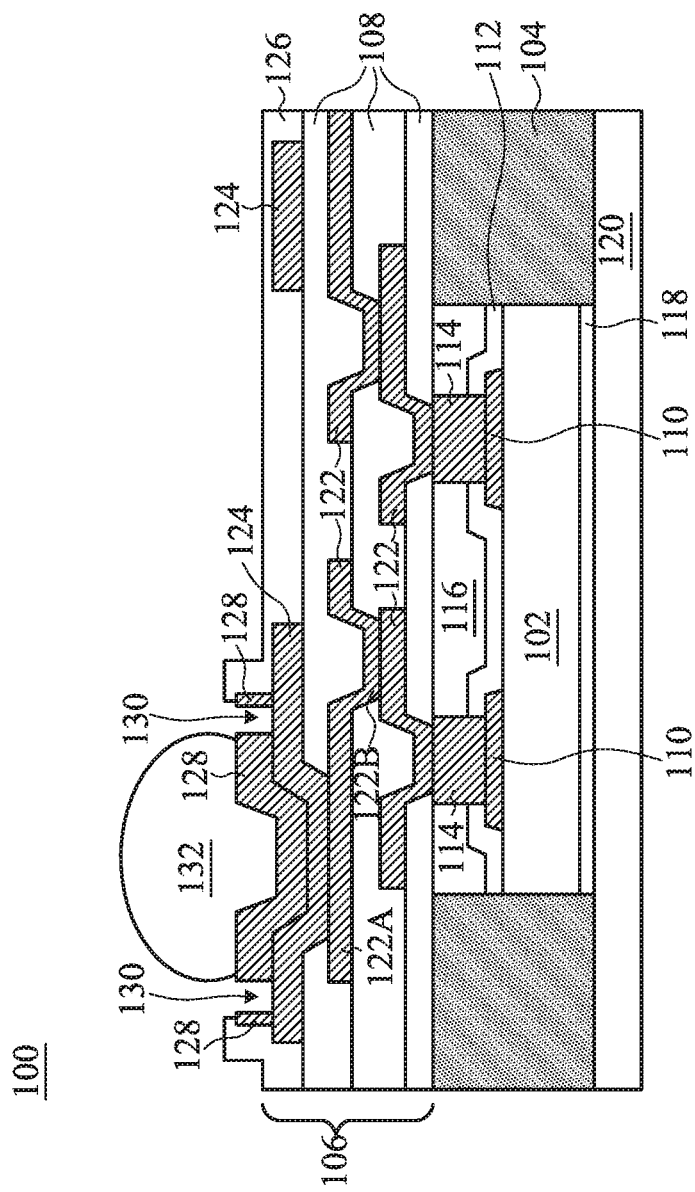

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments include a package having fan-out redistribution layers (RDLs) formed over a semiconductor device die. An under bump metallurgy (UBM) is formed over a top-most conductive line of the RDLs, and a trench is patterned in the UBM. For example, the UBM may include a conductive pad portion and a retaining wall portion encircling the conductive pad portion, where the trench physically separates the conductive pad portion and the retaining wall portion. An external connector (e.g., a solder ball) is mounted on the conductive pad portion of the UBM, and a reflow process may be applied to adhere the connector to the UBM. During reflow, conductive material (e.g., solder flux) may flow out from under the connector. By including a trench and a retaining wall around the conductive pad, the flux may be contained within the UBM, and the flux may not flow outwards to damage other features of the device package. For example, the flux may be prevented from attacking an interface between conductive features and polymer layers of the RDLs. Thus, delamination issues from reflow may be reduced, improving manufacturing yield. Furthermore, the UBM and the conductive line may be formed using a single seed layer, which advantageously reduces manufacturing costs.

FIG. 1A illustrates a cross-sectional view of a fan-out device package 100 in accordance with various embodiments. Package 100 includes a die 102, a molding compound 104 disposed around the die, and RDLs 106 (e.g., having conductive features 122) formed over die 102 and molding compound 104. Die 102 may be a semiconductor die and could be any type of integrated circuit, such as a processor, logic circuitry, memory, analog circuit, digital circuit, mixed signal, and the like.

Die 102 may include a substrate, active devices, and an interconnect structure (not individually illustrated). The substrate may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, the substrate may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

Active devices such as transistors, capacitors, resistors, diodes, photo-diodes, fuses, and the like may be formed at the top surface of the substrate. An interconnect structure may be formed over the active devices and the substrate. The interconnect structure may include inter-layer dielectric (ILD) and/or inter-metal dielectric (IMD) layers containing conductive features (e.g., conductive lines and vias comprising copper, aluminum, tungsten, combinations thereof, and the like) formed using any suitable method. The ILD and IMDs may include low-k dielectric materials having k values, for example, lower than about 4.0 or even 2.0 disposed between such conductive features. In some embodiments, the ILD and IMDs may be made of, for example, phosphosilicate glass (PSG), borophosphosilicate glass (BPSG), fluorosilicate glass (FSG), $SiO_xC_y$, Spin-On-Glass, Spin-On-Polymers, silicon carbon material, compounds thereof, composites thereof, combinations thereof, or the like, formed by any suitable method, such as spinning, chemical vapor deposition (CVD), and plasma-enhanced CVD (PECVD). The interconnect structure electrically connect various active devices to form functional circuits within die 102. The functions provided by such circuits may include memory structures, processing structures, sensors, amplifiers, power distribution, input/output circuitry, or the like. One of ordinary skill in the art will appreciate that the above examples are provided for illustrative purposes only to further explain applications of the present invention and are not meant to limit the present invention in any manner. Other circuitry may be used as appropriate for a given application.

Input/output (I/O) and passivation features may be formed over the interconnect structure. For example, contact pads 110 may be formed over the interconnect structure and may be electrically connected to the active devices through the various conductive features in the interconnect structure. Contact pads 110 may comprise a conductive material such as aluminum, copper, and the like. Furthermore, a passivation layer 112 may be formed over the interconnect structure and the contact pads. In some embodiments, passivation layer 112 may be formed of non-organic materials such as silicon oxide, un-doped silicate glass, silicon oxynitride, and the like. Other suitable passivation materials may also be used. Portions of passivation layer 112 may cover edge portions of the contact pads 110.

Additional interconnect features, such as additional passivation layers, conductive pillars, and/or under bump metallurgy (UBM) layers, may also be optionally formed over contact pad 110. For example, as illustrated by FIG. 1A, conductive pillars 114 may be formed on and electrically connect to contact pads 110, and a dielectric layer 116 may be formed around such conductive pillars 114. The various features of dies 102 may be formed by any suitable method and are not described in further detail herein. Furthermore, the general features and configuration of dies 102 described above are but one example embodiment, and dies 102 may include any combination of any number of the above features as well as other features.

Although described as a die 102 throughout, one of ordinary skill will readily understand that some processing on die 102 may occur while die 102 is part of a larger substrate, for example, a wafer. After formation, die 102 may be singulated from other structures (e.g., other dies) in the wafer and attached to a carrier 120 (e.g., using a die attach film (DAF) 118) for further processing. Carrier 120 may be a glass or ceramic carrier and may provide temporary structural support during the formation of various features of package 100.

Molding compound 104 is disposed around die 102. For example, in a top down view of molding compound 104/die 102 (not illustrated), molding compound 104 may encircle die 102. Molding compound 104 may provide suitable surfaces for forming fan-out RDLs, such as RDLs 106. Molding compound 104 may include any suitable material such as an epoxy resin, a molding underfill, and the like. Suitable methods for forming molding compound 104 may include compressive molding, transfer molding, liquid encapsulant molding, and the like. For example, molding compound 104 may be around die 102 in liquid form. Subsequently, a curing process is performed to solidify molding compound 104. The filling of molding compound 104 may overflow die 102 so that molding compound 104 covers top surfaces of die 102. A mechanical grinding, chemical mechanical polish (CMP), or other etch back technique may be employed to remove excess portions of molding compound 104 and expose connectors (e.g., conductive pillars 114) of die 102. After planarization, top surfaces of molding compound 104 and die 102 may be substantially level.

One or more RDLs 106 may be formed over die 102 and molding compound 104. RDLs 106 may extend laterally past edges of die 102 to provide fan-out interconnect structures. RDLs 106 may include one or more polymer layers 108 formed over top surfaces of die 102 and molding compound 104. In some embodiments, polymer layers 108 may comprise polyimide (PI), PBO, benzocyclobuten (BCB), epoxy, silicone, acrylates, nano-filled pheno resin, siloxane, a fluorinated polymer, polynorbornene, and the like formed using any suitable means such as spin-on techniques, and the like.

Conductive features 122 (e.g., conductive lines 122A and conductive vias 122B) are formed within polymer layers 108. Conductive lines 120A may be formed over polymer layer 108, and conductive vias 120B may extend through polymer layer 108 and electrically connect to contact pads 110 of die 102. Although three polymer layers 108 are explicitly illustrated, RDLs 106 may further include any number of polymer layers having conductive features disposed therein depending on package design.

RDLs 106 may further include a top-most polymer layer 126, which may be disposed at an external surface of package 100. Polymer layer 126 may include top-most conductive lines 124, which are electrically connected to underlying die 102 by conductive features 122. Conductive lines 124 may be redistribution lines for electrical routing as well as a platform for forming input/output features. In some embodiments, conductive lines 124 may also be referred to as under bump metallurgy-less (UBML) pads 124.

Additional package features, such as UBMs 128 and external connectors 132 are formed over conductive lines 124 of RDLs 106. FIG. 1B illustrates a detailed cross-sectional view of such features in package 100. FIG. 1C illustrates a corresponding top down view of UBMs 128, external connectors 132, and conductive line 124. Connectors 132 may be solder balls, such as, ball grid array (BGA) balls, controlled collapse chip connector (C4) bumps, microbumps, and the like. Connectors 132 may be electrically connected to die 102 by way of conductive features 122 in RDLs 106. Connectors 132 may be used to electrically connect package 100 to other package components such as another device die, interposers, package substrates, printed circuit boards, a mother board, and the like.

In various embodiments, connectors 132 are disposed on UBMs 128, which may be formed over conductive lines 124. Although only a single connector 132 and a single UBM 128 are illustrated for simplicity, package 100 may include any number of UBMs 128/connectors 132. An opening may be patterned in polymer layer 126 to expose UBM 128, and polymer layer 126 may cover edge portions of UBMs 128.

In some embodiments, UBMs 128 are formed directly on conductive lines 124. As will be explained in greater detail in subsequent paragraphs, UBMs 128 and conductive lines 124 may be formed using a single seed layer, advantageously reducing manufacturing costs. Trenches 130 are patterned in UBMs 128. For example, trenches 130 physically separate a retaining wall portion 128" and a conductive pad portion 128' of a UBM 128. Trenches 130 may encircle connectors 132 (see e.g., FIG. 1C) to contain flux that may flow out from connectors 132 during reflow. For example, when connectors 132 are mounted onto UBMs 128, a reflow process may be used to bond connectors 132 with UBMs 128. During reflow, flux may flow out from connectors 132 and may attack interfaces between different package materials (e.g., an interface between polymer layer 126 and conductive line 124), which may result in delamination and/or other defects. These defects may further be exacerbated in testing processes, such as thermal cycle tests, which may be applied to package 100. By forming trenches 130 around connectors 132, flux may be contained in trenches 130 without flowing into other areas of package 100, reducing package defects (e.g., delamination between polymer layers and conductive features).

In FIGS. 1B and 1C, lateral dimension W1 corresponds to a distance between a center of connector 132 and a closest edge of conductive line 124 to the center of connector 132. Lateral dimension W2 corresponds to a distance between a center of connector 132 and a farthest edge 128A of UBM 128 to the center of connector 132. Lateral dimension W3 corresponds to a distance between a center of connector 132 and a closest sidewall 126A of polymer layer 126 to the center of connector 132. Lateral dimension W4 corresponds to a distance between a center of connector 132 and a farthest sidewall 128C of trench 130 to the center of connector 132. Lateral dimension W5 corresponds to a distance between a center of connector 132 and a closest sidewall 128B of trench 130 to the center of connector 132. In package 100, lateral dimension W1 is greater than lateral dimension W2 is greater than lateral dimension W3 is greater than lateral dimension W4 is greater than lateral dimension W5. Furthermore, a lateral dimension of trench 130 (e.g., W4 minus W5) may be about 10 μm to about 20 μm. Furthermore, a lateral dimension of retaining wall portion 128" (e.g., W3 minus W4) may also be about 10 μm to about 20 μm.

Figure 2:
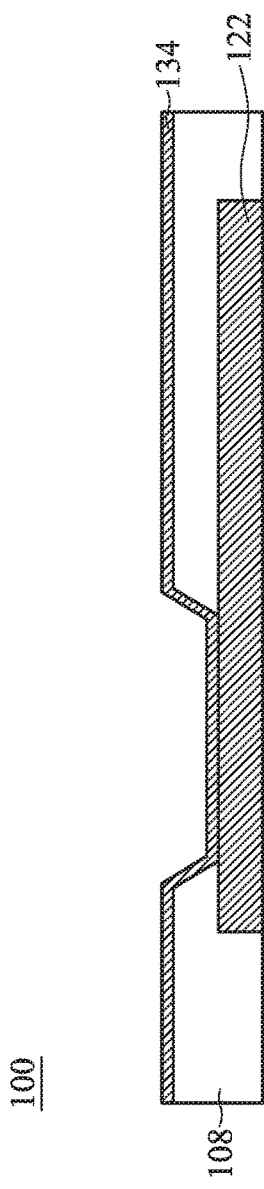
FIGS. 2 through 9 illustrate cross-sectional views of intermediary steps of manufacturing a device package in accordance with some embodiments.

FIGS. 2 through 9 illustrate cross-sectional views of various intermediary stages of forming top-most conductive line 124, UBM 128, and connector 132 in accordance with some embodiments. In FIG. 2, a cross-sectional view of a portion of package 100 (polymer layer 108 having a conductive features 122) is provided. Polymer layer 108 may be part of RDLs 106, which is formed over a device die 102 and molding compound 104 as described above (see FIG. 1A). Also shown FIG. 2 is a conductive seed layer 134 comprising copper, for example. Seed layer 134 is electrically connected to underlying conductive feature 122. In an embodiment, forming seed layer 134 includes an opening in polymer layer 108 to expose conductive feature 122 using photolithography and/or etching, for example. Subsequently, seed layer 134 may be deposited over polymer layer 108 and in the opening using atomic layer deposition, CVD, or other conformal process.

Figure 3:
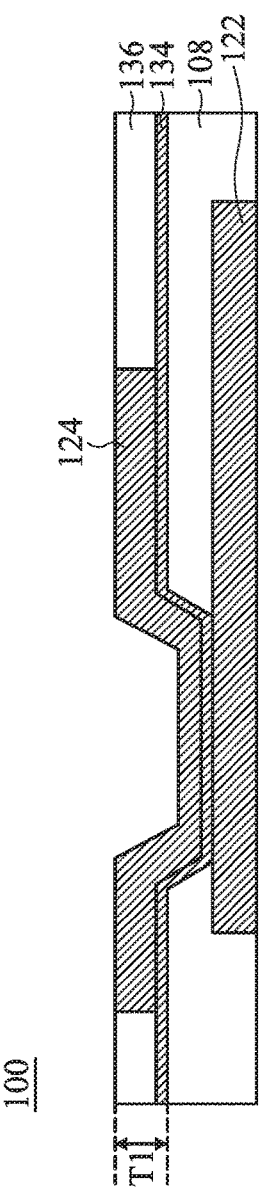

Referring next to FIG. 3, conductive line 124 is formed on seed layer 134. A patterned mask layer 136 may be used to define a shape of conductive line 124. In an embodiment, mask layer 136 is a photoresist blanket deposited over seed layer 134 and subsequently patterned using photolithography, for example. The photolithography process may include, for example, exposing portions of mask layer 136 through a lithography mask using ultraviolet light, for example. Subsequently, exposed or unexposed portions of mask layer 136 are developed and removed depending on whether a positive or negative resist is used. Thus, an opening exposing seed layer 134 may be formed in mask layer 136. In another embodiment, mask layer 136 may be a hard mask (e.g., comprising silicon nitride, and the like). In such embodiments a photoresist (not shown) may be formed and patterned over mask layer 136, and the pattern of the photoresist is then transferred to mask layer 136 using a suitable etching process, for example.

After mask layer 136 is patterned, conductive line 124 is formed in the opening using a suitable process, such as, electroless plating, electro-chemical plating, and the like. Seed layer 134 provides nucleation sites during the plating process to allow for bottom up growth of conductive line 124 having good uniformity. As a result of the plating process, conductive line 124 may merge with underlying seed layer 134, and a total thickness T1 of conductive line 124 (including seed layer 134) may be about 5 μm to about 8 μm in an example embodiment. Other dimensions for conductive line 124 may be used in other embodiments. After conductive line 124 is formed, mask layer 136 may be removed using any suitable process. For example, when mask layer 136 is a photoresist, a plasma ashing or wet strip process may be used to remove mask layer 136. Optionally, the plasma ashing process may be followed by a wet dip in a sulfuric acid ($H_2SO_4$) solution to package 100 and remove remaining photoresist material. In another example, when mask layer 136 is a hard mask, a selective etching process may be used to remove mask layer 136.

Figure 4:
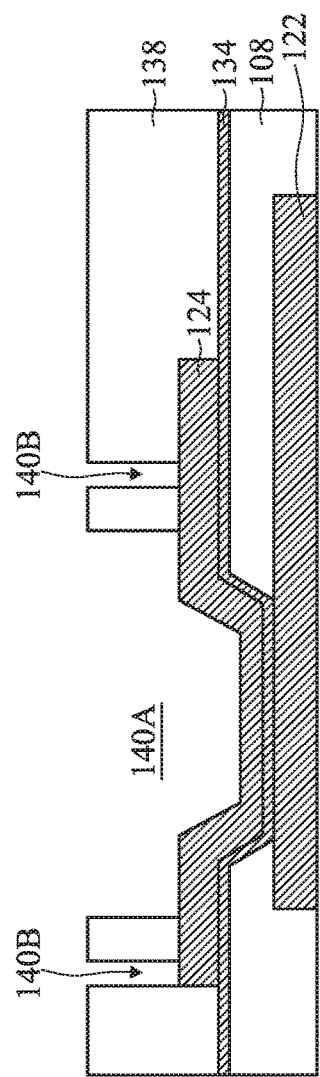
Figure 5:
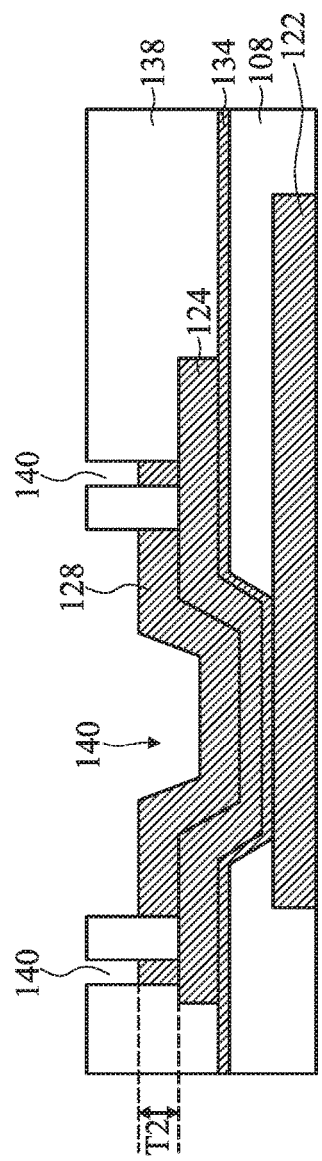

Next, in FIGS. 4 and 5, UBMs 128 are formed over seed layer 134 and conductive line 124. In FIG. 4, a second mask layer 138 is deposited over seed layer 134 and conductive line 124. Mask layer 138 may be similar to mask layer 136, and mask layer 138 may be patterned to include openings 140 (labeled 140A and 140B) using a similar process as described above. Openings 140 expose underlying conductive line 124, and mask layer may be used to define a shape of each UBM 128. For example, openings 140 may include a first opening 140A for defining a conductive pad portion of an UBM 128 and a second opening 140B for defining a retaining wall portion of UBM 128. In a top-down view (not shown), opening 140B may encircle opening 140A. A portion of mask layer 138 may remain disposed between the openings 140A and 140B.

Next, in FIG. 5, UBMs 128 are formed in openings 140 using a suitable process, such as, electroless plating, electro-chemical plating, and the like. UBMs 128 have a thickness T2 of about 1.5 μm to about 5 μm, for example. Other dimensions for UBMs 128 may be used in other embodiments. UBMs 128 may be formed directly on an exposed surface of conductive line 124, and the conductive material of conductive line 124 provides nucleation sites during the formation of UBMs 128. As discussed above, conductive lines 124 is patterned to provide electrical routing for circuitry in package 100. Thus, in some areas of package 100

(e.g., in areas where conductive lines 124 are not available), UBMs 128 may be formed directly on seed layer 134 (not explicitly illustrated). In such areas, seed layer 134 provides nucleation sites for the formation of UBMs 128. Thus, in example embodiments, a single seed layer 134 is used to form both conductive lines 124 and UBMs 128, saving manufacturing costs. For example, seed layer 134 is not etched before UBMs 128 are formed.

Figure 6B:
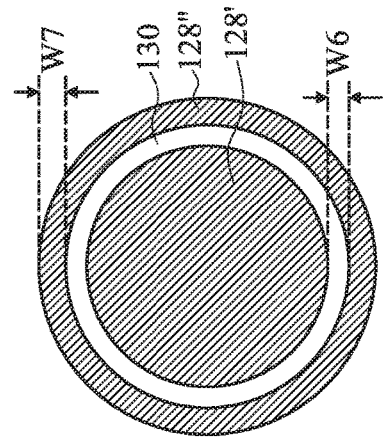
Figure 6A:
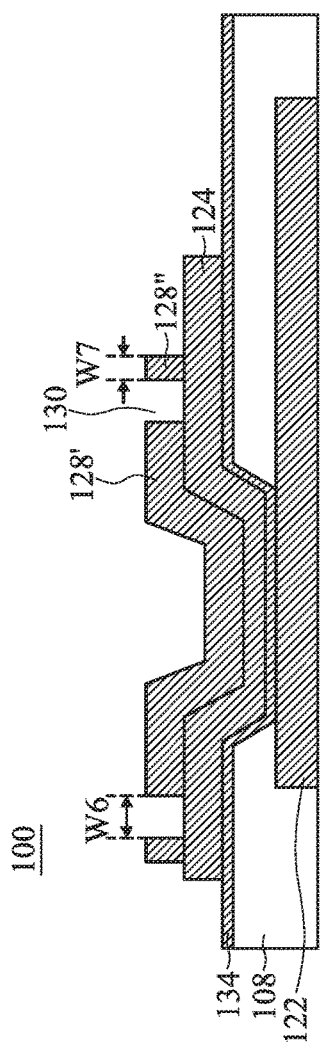

Subsequently, mask layer 138 is removed as described above. The resulting structure is illustrated in FIGS. 6A and 6B. FIG. 6A illustrates a cross-sectional view, and FIG. 6B illustrates a corresponding top-down view of UBM 128. UBM 128 includes a trench 130 encircling a conductive pad portion 128' of UBM 128 (see FIG. 6B). In subsequent process steps, an external connector (e.g., a solder ball) is disposed on conductive pad portion 128' of UBM 128. A retaining wall portion 128" forms a ring around trench 130 and conductive pad portion 128'. As illustrated in FIG. 6B, retaining wall portion 128" encircles trench 130 and conductive pad portion 128'. For example, retaining wall portion 128" is physically separated from conductive pad by a spacing (trench 130). Trench 130 has a width W6 of about 10 μm to about 20 μm, for example. Width W6 also corresponds a spacing between retaining wall portion 128" and conductive pad portion 128' of UBM 128. Retaining wall portion 128" has a width W7 of about 10 μm to about 20 μm, for example. Thus, UBM 128 have a trench 130 patterned therein may be formed over conductive line 124 and seed layer 134.

Figure 7:
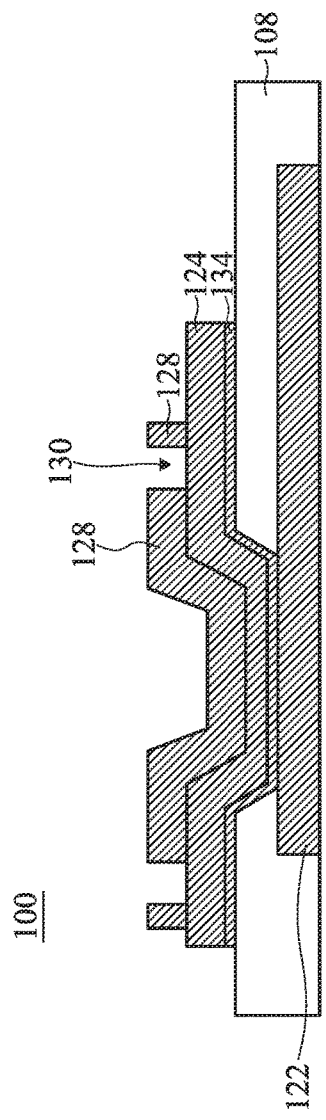
Figure 8:
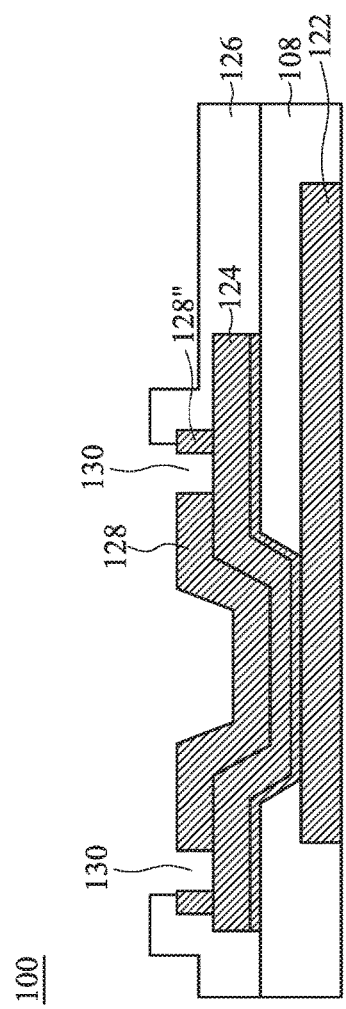

After UBM 128 is formed, seed layer 138 is patterned using a combination of photolithography and etching, for example. For example, portions of seed layer 138 not covered by conductive line 124 or UBM 128 is removed. The resulting structure is illustrated in FIG. 7. Next, in FIG. 8, a polymer layer 126 is formed over polymer layer 108, conductive line 124, and UBM 128. Polymer layer 126 may cover edge portions of UBM 128. In some embodiments, polymer layer 126 is first deposited as a conformal layer using a suitable process, such as CVD, and the like. Polymer layer 126 is then patterned to at least partially expose UBM 128 using photolithography and/or etching processes, for example. In package 100, sidewalls of polymer layer 126 may be disposed on a top surface of a retaining wall portion of UBM 128.

Figure 9:
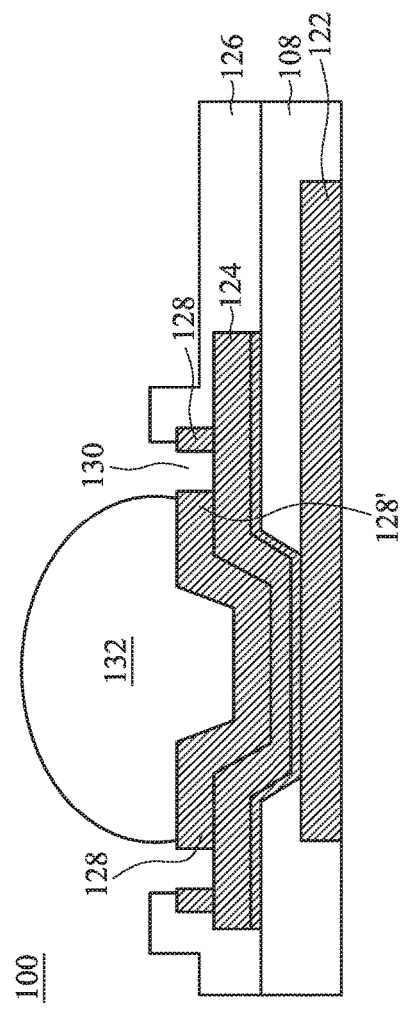

Subsequently, in FIG. 9, a connector 132 is mounted onto UBM 128. Connector 132 is disposed on a conductive pad portion 128' of UBM 128. In an embodiment, connectors 132 are mounted by initially placing a solder flux (not shown) onto the conductive pad portion 128' of UBM 128. The solder flux may be applied by brushing, spraying, a stencil, or other methods, as examples. The solder flux generally has an acidic component that removes oxide barriers, and an adhesive quality that helps to prevent movement during the process. The solder flux may be simultaneously placed on all UBMs 128 in package 100. Other types of materials may also be utilized to aid the connection between connector 132 and UBMs 128, such as a solder paste, an adhesive, or the like.

Once the solder flux is in place, connector 132 may be physically placed in contact with the solder flux using, e.g., a pick and place operation, although any suitable placement methodology may alternatively be utilized. Once in contact, a reflow may be performed to reflow the material of connector 132 and the solder flux to physically bond the connector 132 to underlying UBM 128. The reflow process may cause a chemical reaction that consumes a portion of UBM 128 and/or underlying conductive line 124. Thus, UBM 128 and conductive line 124 are formed at a sufficient thickness (e.g., in the example thickness ranges given above) to accommodate such reactions caused by reflow without damaging underlying package features.

Furthermore, during reflow, the solder flux or the material of connector 132 may spread laterally out from under connector 132. Trenches 130 and retaining wall portion 128" are used to contain the flow of such materials. Thus, the conductive material may be contained away from attacking other device features, which reduces the risk of manufacturing defects (e.g., delamination).

Figure 10A:
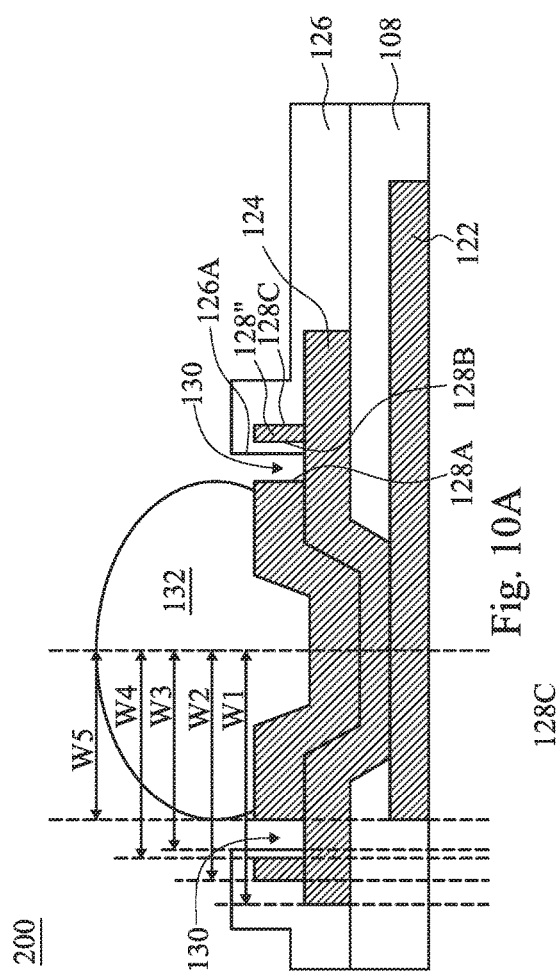
FIGS. 10A and 10B illustrate cross-sectional views of a device package in accordance with some alternative embodiments.
Figure 10B:
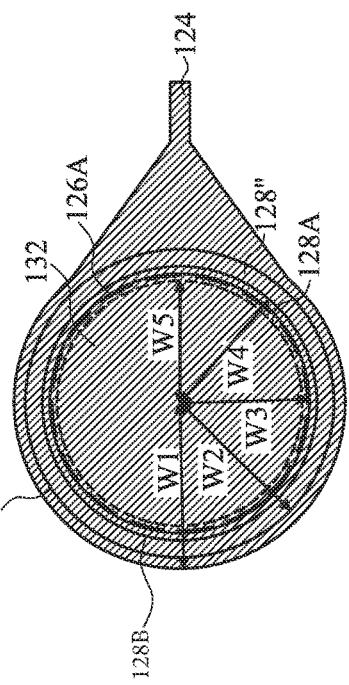

FIG. 10A illustrates a cross-sectional view of a package 200 in accordance with an alternative embodiment while FIG. 10B illustrates a corresponding top down view. Package 200 may be similar to package 100 where like reference numerals indicate like elements. In package 200, at least a portion of polymer layer 126 may be disposed in trench 130. That is, retaining wall portion 128" of UBM 128 may be completely covered by polymer layer 126. In package 200, lateral dimension W1 is greater than lateral dimension W2 is greater than lateral dimension W4 is greater than lateral dimension W3 is greater than lateral dimension W5.

FIG. 11A illustrates a cross-sectional view of a package 300 in accordance with an alternative embodiment while FIG. 11B illustrates a corresponding top down view. Package 300 may be similar to package 100 where like reference numerals indicate like elements. In package 300, an entirety of UBM 128 may be exposed by an opening in polymer layer 126. That is, polymer layer 126 does not cover any portions of UBM 128, and polymer layer 126 encircles UBM 128. In package 300, lateral dimension W1 is greater than lateral dimension W3 is greater than lateral dimension W2 is greater than lateral dimension W4 is greater than lateral dimension W5.

Figure 12:
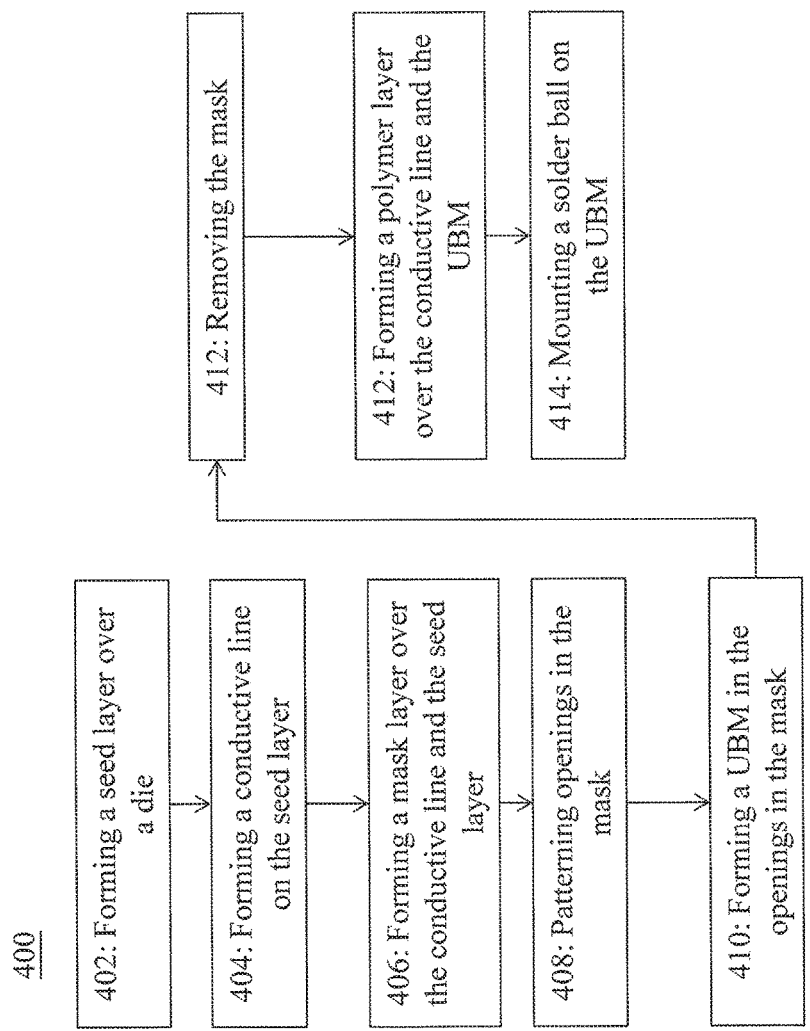
FIG. 12 illustrates a process flow for forming a device package in accordance with some embodiments.

FIG. 12 illustrates and example process flow 400 for forming a device package in accordance with various embodiments. In step 402, a seed layer (e.g., seed layer 134) is formed over a die (e.g., die 102). The seed layer may be formed over fan-out RDLs (e.g., RDLs 106) over the die. In step 404, a conductive line (e.g., conductive line 124) is formed on the seed layer. For example, a mask layer (e.g., mask layer 136) may be used to define a shape of the conductive line, and the conductive layer may be formed using a plating process using the seed layer to provide nucleation sites. The mask layer is then removed.

In step 408, a mask layer (e.g., mask layer 138) is formed over the conductive line and the seed layer. The mask layer may be different than the one used to form the conductive layer. In step 408, openings (e.g., openings 140) are patterned in the mask layer. The openings may include a first opening (e.g., opening 140A) for a conductive pad portion (e.g., conductive pad portion 128') of a UBM. The openings may include a second opening (e.g., opening 140B) for a retaining wall portion (e.g., retaining wall portion 128") of the UBM. A portion of the mask layer may remain disposed between the first and second openings. In step 410, a UBM (e.g., UBM 128) is formed in the openings of the mask layer. For example, a conductive pad portion of the UBM may be formed by filling the first opening, and a retaining wall portion of the UBM may be formed by filing the second opening. During the formation of the UBM, the conductive line and/or the seed layer may provide nucleation sites for a plating process. Then, in step 412, the mask layer is removed.

In step 412, a polymer layer (e.g., polymer layer 126) is formed over the conductive line and the UBM. An opening may be patterned in the polymer layer to expose the UBM.

In an embodiment, the polymer layer may be cover edge portions of the UBM (e.g., edge portions of the retaining wall portion of the UBM). IN an embodiment, the polymer layer may completely expose the UBM. In an embodiment, the polymer layer completely covers the retaining wall portion of the UBM. In step 414, a connector (e.g., connector 132) is mounted on the UBM. The connector may be mounted on the conductive pad portion of the UBM.

Thus, in various embodiments, a UBM is formed over a top-most conductive line of the RDLs. The UBM may include a conductive pad portion and a retaining wall portion encircling the conductive pad portion, where a trench physically separates the conductive pad portion and the retaining wall portion. An external connector (e.g., a solder ball) is mounted on the conductive pad portion of the UBM, and a reflow process may be applied to adhere the connector to the UBM. By including a trench and a retaining wall around the conductive pad, the flux may be contained within the UBM during reflow processes. Thus, delamination issues from reflow may be reduced, improving manufacturing yield. Furthermore, the UBM and the conductive line may be formed using a single seed layer, which advantageously reduces manufacturing costs.

In accordance with an embodiment, a method for forming a device package includes forming a seed layer over a die, forming a conductive line on the seed layer, forming a first mask layer over the conductive line and the seed layer, and patterning openings in the first mask layer. The openings include a first opening for a conductive pad portion of an under bump metallurgy (UBM), and a second opening for a retaining wall portion of the UBM. The second opening forms a ring around the first opening, and a portion of the first mask layer remains disposed between the first opening and the second opening. The method further includes forming the UBM in the first opening and the second opening, removing the first mask, and mounting a solder ball to the conductive pad portion of the UBM. The conductive pad portion of the UBM contacts a surface of the conductive line, while the retaining wall portion of the UBM has a bottom-most portion physically contacting the conductive line.

In accordance with another embodiment, a method for forming a device package includes patterning openings in a mask layer to expose a conductive line. The openings include a central opening for a conductive pad portion of an under bump metallurgy (UBM), and a peripheral opening for a retaining wall portion of the UBM, wherein the peripheral opening forms a ring around the central opening. The method further includes filling the central opening and the peripheral opening with conductive material to form the UBM. The conductive pad portion of the UBM contacts a surface of the conductive line, and the retaining wall portion of the UBM has a bottom-most portion physically contacting the conductive line.

In accordance with yet another embodiment, a method for forming a device package includes forming a redistribution layer (RDL) over a die, and forming a polymer layer over the RDL. The polymer layer has an opening exposing a portion of the RDL. The method includes depositing a seed layer over the polymer layer and the RDL, and over sidewalls of the opening, forming a conductive line on the seed layer, and forming a first mask layer having a first opening and a second opening over the conductive line and the seed layer. The method additionally includes forming an under bump metallurgy (UBM) in the first opening and the second opening. The UBM includes a conductive pad portion within the first opening, and the conductive pad portion contacts a surface of the conductive line. The UBM further includes a retaining wall portion within the second opening, and the retaining wall portion has a bottom-most portion physically contacting the conductive line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed:

1. A method for forming a device package, the method comprising:
   forming a seed layer over a die;
   forming a conductive line on the seed layer;
   forming a first mask layer over the conductive line and the seed layer;
   patterning openings in the first mask layer, wherein the openings comprise:
      a first opening for a conductive pad portion of an under bump metallurgy (UBM); and
      a second opening for a retaining wall portion of the UBM, wherein the second opening forms a ring around the first opening, and wherein a portion of the first mask layer remains disposed between the first opening and the second opening;
   forming the UBM in the first opening and the second opening, the UBM comprising the conductive pad portion contacting a surface of the conductive line, the UBM further comprising the retaining wall portion having a bottom-most portion that physically contacts the conductive line;
   removing the first mask layer to form a trench that encircles the conductive pad portion of the UBM and separates the conductive pad portion of the UBM from the retaining wall portion of the UBM;
   forming an insulating layer that physically contacts a sidewall of the bottom-most portion of the retaining wall portion of the UBM, wherein the sidewall is directed away from the trench; and
   mounting a solder ball to the conductive pad portion of the UBM.

2. The method of claim 1, wherein forming the UBM comprises filling the first opening and the second opening with conductive material.

3. The method of claim 2, wherein filling the first opening and the second opening with conductive material comprises providing nucleation sites for a plating process, wherein the nucleation sites are provided by at least one of the conductive line or the seed layer.

4. The method of claim 1, wherein forming the conductive line comprises:
   before forming the first mask layer, forming a second mask layer over the seed layer;
   patterning a third opening in the second mask layer, wherein the third opening exposes the seed layer; and
   filling the third opening with a conductive material to form the conductive line.

5. The method of claim 1, further comprising etching portions of the seed layer.

6. The method of claim 5, wherein the seed layer is not etched until after forming the UBM.

7. The method of claim 1, further comprising:
forming a polymer layer over the UBM; and
patterning the polymer layer to expose at least a portion of the UBM.

8. The method of claim 7, wherein, after patterning the polymer layer, the conductive pad portion is free from the polymer layer and the polymer layer overlies outermost sidewalls of the retaining wall portion of the UBM.

9. A method for forming a device package, the method comprising:
patterning openings in a mask layer to expose a conductive line, wherein the openings comprise:
a central opening for a conductive pad portion of an under bump metallurgy (UBM); and
a peripheral opening for a retaining wall portion of the UBM, wherein the peripheral opening forms a ring around the central opening; and
filling the central opening and the peripheral opening with conductive material to form the UBM, wherein the conductive pad portion of the UBM contacts a surface of the conductive line, wherein the retaining wall portion of the UBM has a bottom-most portion having a bottom-most surface physically contacting the conductive line, and wherein a sidewall of the bottom-most portion of the retaining wall portion of the UBM is directed away from the conductive pad portion of the UBM and physically contacts an insulating material.

10. The method of claim 9, wherein the conductive pad portion of the UBM physically contacts the surface of the conductive line.

11. The method of claim 9, wherein a portion of the mask layer separates the central opening from the peripheral opening.

12. The method of claim 11, wherein a dimension of the portion of the mask layer is between 10 micrometers and 20 micrometers.

13. The method of claim 9, wherein filling the central opening and the peripheral opening with conductive material comprises a plating process using the mask layer as a plating mask.

14. The method of claim 9, wherein filling the central opening and the peripheral opening with conductive material comprises providing nucleation sites for a plating process, wherein the nucleation sites are provided by at least one of the conductive line or a seed layer.

15. The method of claim 9, wherein a dimension of the retaining wall portion of the UBM is between 10 micrometers and 20 micrometers.

16. The method of claim 9, further comprising:
removing the mask layer to form a trench between the conductive pad portion of the UBM and the retaining wall portion of the UBM; and
forming a connector over the conductive pad portion of the UBM, wherein no portion of the connector is disposed in the trench.

17. A method for forming a device package, the method comprising:
forming a redistribution layer (RDL) over a die;
forming a polymer layer over the RDL, the polymer layer having an opening exposing a portion of the RDL;
depositing a seed layer over the polymer layer and the RDL, and over sidewalls of the opening;
forming a conductive line on the seed layer;
forming a first mask layer having a first opening and a second opening over the conductive line and the seed layer; and
forming an under bump metallurgy (UBM) in the first opening and the second opening, the UBM comprising a conductive pad portion within the first opening, the conductive pad portion contacting a surface of the conductive line, the UBM further comprising a retaining wall portion within the second opening, the retaining wall portion having a bottom-most portion having a bottom-most surface physically contacting the conductive line, wherein a sidewall of the bottom-most portion of the retaining wall portion of the UBM is directed away from the conductive pad portion of the UBM and physically contacts an insulating material.

18. The method of claim 17, wherein the second opening forms a ring around the first opening and is separated from the first opening by a distance between 10 micrometers and 20 micrometers.

19. The method of claim 17, further comprising:
removing the first mask layer to form a trench between the conductive pad portion of the UBM and the retaining wall portion of the UBM; and
forming a connector over the conductive pad portion of the UBM.

20. The method of claim 19, wherein no portion of the connector is disposed in the trench and no portion of the connector is disposed on the retaining wall portion of the UBM.

* * * * *